US010734201B2

(12) United States Patent
Doba et al.

(10) Patent No.: US 10,734,201 B2
(45) Date of Patent: Aug. 4, 2020

(54) SUBSTRATE PROCESSING APPARATUS (71) Applicant: TOKYO ELECTRON LIMITED, Tokyo (JP)

(72) Inventors: Shigeki Doba, Yamanashi (JP);
Hiroyuki Ogawa, Yamanashi (JP);
Hajime Naito, Yamanashi (JP);
Akitaka Shimizu, Yamanashi (JP);
Tatsuo Matsudo, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 315 days.

(21) Appl. No.: 15/449,675

(22) Filed: Mar. 3, 2017

(65) Prior Publication Data

US 2017/0256382 A1    Sep. 7, 2017

(30) Foreign Application Priority Data

Mar. 4, 2016  (JP) ................. 2016-042010

(51) Int. Cl.
*H01J 37/32* (2006.01)
*H01L 21/67* (2006.01)

(52) U.S. Cl.
CPC ..... *H01J 37/32357* (2013.01); *H01J 37/3211* (2013.01); *H01J 37/32119* (2013.01); *H01J 37/32422* (2013.01); *H01J 37/32467* (2013.01); *H01J 37/32495* (2013.01); *H01L 21/67069* (2013.01)

(58) Field of Classification Search
CPC ........... H01J 37/32513; H01J 37/37724; H01J 37/32834
See application file for complete search history.

(56) References Cited

U.S. PATENT DOCUMENTS

| 4,491,496 A | 1/1985 | Laporte et al. |
| 2005/0205013 A1* | 9/2005 | Nakanishi ................. C23C 8/36 118/723 AN |
| 2009/0065480 A1* | 3/2009 | Ohmi ................ H01J 37/32192 216/69 |

(Continued)

FOREIGN PATENT DOCUMENTS

| CN | 101647103 A | 2/2010 |
| JP | H06-140368 A | 5/1994 |

(Continued)

*Primary Examiner* — Robert M Kunemund
(74) *Attorney, Agent, or Firm* — Fenwick & West LLP (57) ABSTRACT

A substrate processing apparatus, for generating a plasma from a gas by a high frequency energy and etching a substrate in a processing chamber by radicals in the plasma, includes a high frequency power supply configured to supply the high frequency energy into the processing chamber, a gas supply source configured to introduce the gas into the processing chamber, a mounting table configured to mount the substrate thereon, and a partition plate provided in the processing chamber and configured to divide an inner space of the processing chamber into a plasma generation space and a substrate processing space and suppress passage of ions therethrough. The partition plate and a portion of an inner wall surface of the processing chamber which is positioned at least above the mounting table are covered by a dielectric material having a recombination coefficient of 0.002 or less.

8 Claims, 5 Drawing Sheets

(56) References Cited

U.S. PATENT DOCUMENTS

| | | |
|---|---|---|
| 2010/0037822 A1 | 2/2010 | Ishibashi et al. |
| 2010/0078129 A1* | 4/2010 | Himori .............. H01L 21/6833 |
| | | 156/345.43 |
| 2015/0056381 A1* | 2/2015 | Hori ...................... B01J 19/088 |
| | | 427/535 |
| 2015/0132970 A1 | 5/2015 | Nishimura et al. |
| 2016/0118224 A1* | 4/2016 | Kohno .............. H01J 37/32192 |
| | | 156/345.51 |

FOREIGN PATENT DOCUMENTS

| | | |
|---|---|---|
| JP | 2004-193566 A | 7/2004 |
| JP | 2010-528488 A | 8/2010 |
| KR | 10-2007-0114828 A | 12/2007 |
| KR | 10-2009-0098952 A | 9/2009 |
| KR | 10-2010-0005703 A | 1/2010 |
| KR | 10-2012-0069755 A | 6/2012 |
| WO | 2007120276 A2 | 10/2007 |
| WO | WO 2008/117832 A1 | 10/2008 |
| WO | WO 2008/153785 A2 | 12/2008 |
| WO | 2013/175897 | 11/2013 |

\* cited by examiner

| Radical | Surface | Recombination probability r |
|---|---|---|
| H | Silica(quartz) | 0.00004±0.00003 |
|  | Alumina | 0.0018±0.0003 |
|  | Pyrex(registered trademark) | 0.0058±0.0018 |
|  | Stainless steel | 0.032±0.015 |
|  | Silicon | 0.70±0.10 |
|  | Titanium | 0.35 |
|  | Aluminum | 0.29 |
|  | Nickel | 0.20±0.09 |
|  | Copper | 0.14 |
|  | Gold | 0.15±0.05 |
|  | Palladium | 0.07±0.015 |
|  | Platinum | 0.03 |
| N | Silica | 0.0003±0.0002 |
|  | Stainless steel | 0.0063 |
|  | Silicon | 0.0016 |
|  | Aluminum | 0.0018 |
| O | Silica | 0.0002±0.0001 |
|  | Pyrex(registered trademark) | 0.000045 |
|  | Aluminum oxide | 0.0021 |
|  | Zinc oxide | 0.00044 |
|  | Ferric oxide | 0.0052 |
|  | Cobalt oxide | 0.0049 |
|  | Nickel oxide | 0.0089 |
|  | Cupric oxide | 0.043 |
|  | Stainless steel | 0.070±0.009 |

| Radical | Surface | Recombination probability r |
|---|---|---|
| F | Alumina(Al₂O₃) | 0.000064 |
| | Teflon(registered trademark) | < 0.00007 |
| | Quartz,Pyrex | 0.00016 |
| | SUS304 | 0.00028 |
| | Molybdenum | 0.00042 |
| | Nickel | 0.00072 |
| | Aluminum | 0.0018 |
| | Copper,Brass,Zinc | > 0.01 |

SUBSTRATE PROCESSING APPARATUS

CROSS-REFERENCE TO RELATED APPLICATIONS

This application claims priority to Japanese Patent Application No. 2016-042010 filed on Mar. 4, 2016, the entire contents of which is incorporated herein by reference.

FIELD OF THE INVENTION

The disclosure relates to a substrate processing apparatus.

BACKGROUND OF THE INVENTION

There has been suggested a method for etching a semiconductor wafer (hereinafter, referred to as "wafer") in a processing chamber mainly by radicals in a plasma (see, e.g., PCT Publication No. 2013/175897). In the case of etching the wafer mainly by radicals, action of ions in the plasma on the wafer may need to be suppressed. Therefore, a partition plate for dividing an inner space of the processing chamber into a plasma generation space and a substrate processing space is provided inside the processing chamber. The partition plate suppresses passage of ions in the plasma from the plasma generation space to the substrate processing space.

On the other hand, the radicals in the plasma pass through the partition plate to reach the substrate processing space and contribute to the etching of the wafer. Therefore, the etching using radicals can be performed while suppressing approach of ions to the surface of the wafer. At this time, since the radicals reach the surface of the wafer without inactivation, an etching rate is increased. Accordingly, the etching process can be promoted. The inactivation of the radicals indicates that the radicals lose activity.

When the radicals are diffused and adsorbed onto the inner wall surface of the processing chamber and the components in the processing chamber, the adsorbed radicals are inactivated. Especially, when a distance between the wafer provided in the processing chamber and the inner wall of the processing chamber is short, it is easy for the radicals to be adsorbed onto the inner wall of the processing chamber, and the amount of inactivated radicals is increased. Thus, an etching rate becomes lower at an outer peripheral side than at an inner peripheral side of the wafer. Accordingly, in-plane uniformity of the etching deteriorates.

SUMMARY OF THE INVENTION

In view of the above, the disclosure provides a technique for suppressing inactivation of radicals and achieving uniformity of etching.

In accordance with an aspect, there is provided a substrate processing apparatus for generating a plasma from a gas by a high frequency energy and etching a substrate in a processing chamber by radicals in the plasma, including: a high frequency power supply configured to supply the high frequency energy into the processing chamber; a gas supply source configured to introduce the gas into the processing chamber; a mounting table configured to mount the substrate thereon; and a partition plate provided in the processing chamber and configured to divide an inner space of the processing chamber into a plasma generation space and a substrate processing space and suppress passage of ions therethrough, wherein the partition plate and a portion of an inner wall surface of the processing chamber which is positioned at least above the mounting table are covered by a dielectric material having a recombination coefficient of 0.002 or less.

BRIEF DESCRIPTION OF THE DRAWINGS

The objects and features of the disclosure will become apparent from the following description of embodiments, given in conjunction with the accompanying drawings, in which.

DETAILED DESCRIPTION OF THE EMBODIMENTS

Hereinafter, embodiments will be described with reference to the accompanying drawings. Like reference numerals will be used for substantially like parts throughout the specification and the drawings, and redundant description thereof will be omitted.

(Configuration of Substrate Processing System)

Figure 1:
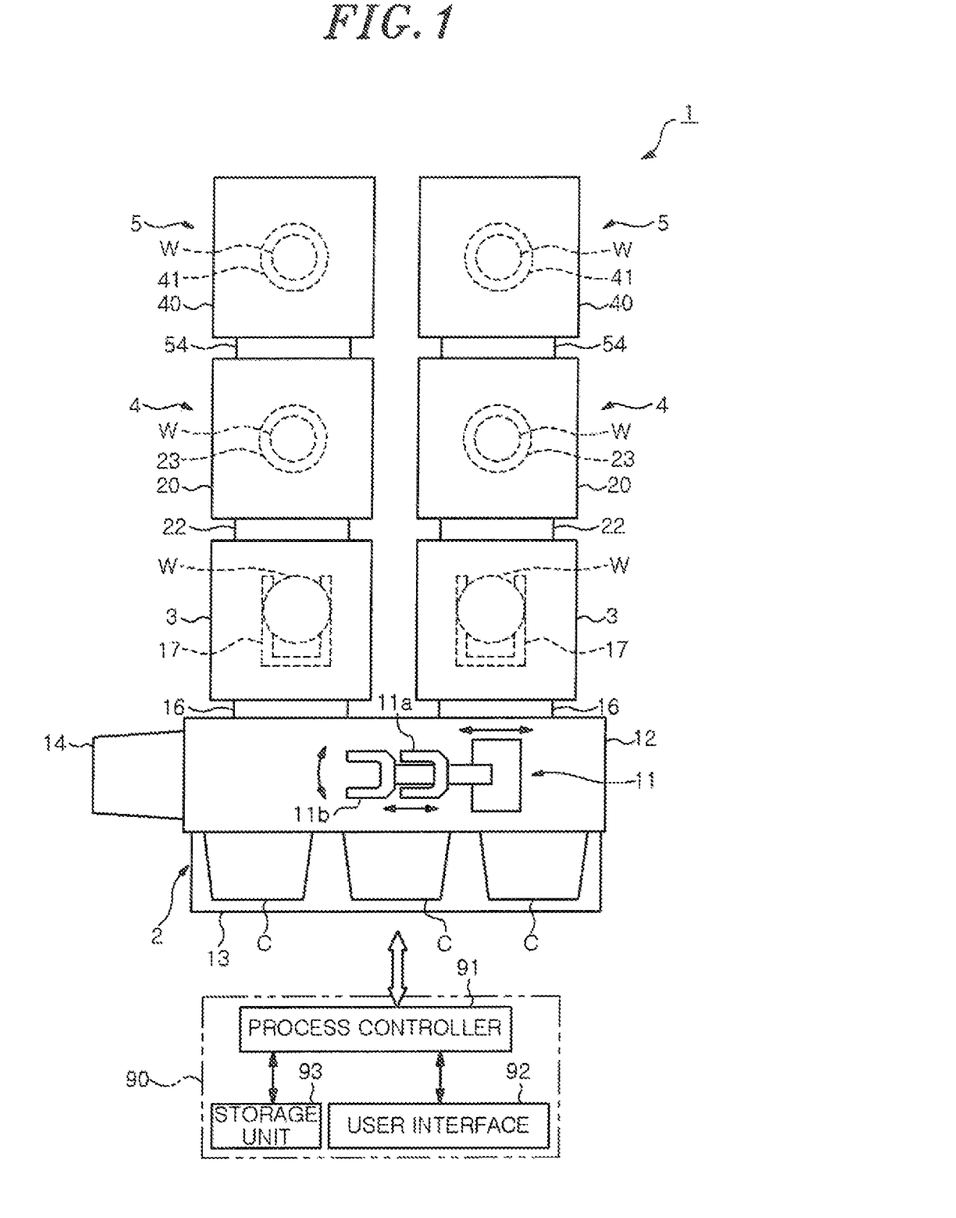
FIG. 1 shows an example of a substrate processing system including a radical processing apparatus according to an embodiment.

First, a substrate processing system including a radical processing apparatus according to an embodiment will be described with reference to FIG. 1. The radical processing apparatus is an example of a substrate processing apparatus.

A substrate processing system 1 of the present embodiment includes a loader module 2, two load-lock chambers 3, two PHT (Post Heat Treatment) processing apparatuses 4, and two radical processing apparatuses 5. The loader module 2 allows loading/unloading of a wafer W that is an example of an unprocessed substrate. The two load-lock chambers 3 are provided adjacent to the loader module 2. The PHT processing apparatuses 4 are provided adjacent to the respective load-lock chambers 3. Each of the PHT processing apparatuses 4 performs PHT on the wafer W. The radical processing apparatuses 5 are provided adjacent to the respective PHT processing apparatuses 4. Each of the radical processing apparatuses 5 performs radical processing on the wafer W.

The load-lock chamber 3, the PHT processing apparatus 4 and the radical processing apparatus 5 are arranged linearly in that order. The PHT processing apparatus 4 and the radical processing apparatus 5 are configured to process wafers W one by one. However, the PHT processing apparatus 4 and the radical processing apparatus 5 may process two wafers W at a time.

The loader module 2 includes a transfer chamber 12 where a first wafer transfer unit 11 for transferring the wafer W is provided. The first wafer transfer unit 11 has two transfer arms 11a and 11b for substantially horizontally supporting the wafer W. A stage 13 is provided at a longitudinal side of the transfer chamber 12. For example, three carriers C, each capable of accommodating a plurality of wafers W, can be connected to the stage 13. An orienter 14 for performing position alignment by rotating the wafer W to optically obtain eccentricity is provided near the transfer chamber 12.

In the loader module 2, the wafer W is held by the transfer arm 11a or 11b. The first wafer transfer unit 11 can transfer the wafer W to a desired position by linearly moving the wafer W in a substantially horizontal plane and vertically moving the wafer W. The wafer W is loaded into and unloaded from the carriers C on the stage 13, the orienter 14, and the load-lock chambers 3 by the extension and retraction of the transfer arm 11a or 11b.

Each of the load-lock chambers 3 is connected to the transfer chamber 12 through a gate valve 16. A second wafer transfer unit 17 for transferring the wafer W is provided in each of the load-lock chambers 3. The load-lock chambers 3 can be evacuated to a predetermined vacuum level.

The second wafer transfer unit 17 has a multi-joint arm structure and a pick for substantially horizontally holding the wafer W. In the second wafer transfer unit 17, the pick is positioned in the load-lock chamber 3 when the arm is retracted. The pick reaches the PHT processing apparatus 4 when the arm is extended. The pick can reach the radical processing apparatus 5 when the arm is further extended. Therefore, the wafer W can be transferred between the load-lock chamber 3, the PHT processing apparatus 4 and the radical processing apparatus 5.

The PHT processing apparatus 4 includes a vacuum evacuable processing chamber 20 and a mounting table 23 for horizontally mounting thereon the wafer W in the processing chamber 20. A heater is embedded in the mounting table 23. By heating the wafer W that has been subjected to the radical processing by the heater, PHT processing for vaporizing reaction by-products generated by the radical processing is performed. During the PHT processing, an inert gas such as $N_2$ gas or the like is introduced into the processing chamber 20. A gate valve 22 is provided at a side of the processing chamber 20 which faces the load-lock chamber 3. A gate valve 54 is provided at a side of the processing chamber 20 which faces the radical processing apparatus 5.

The radical processing apparatus 5 of the present embodiment performs the radical processing on an oxide film on the surface of the wafer W mounted on a mounting table 41 in a processing chamber 40 by using a fluorine-containing gas and a hydrogen-containing gas (e.g., $NH_3$). In other words, radicals obtained by activating the fluorine-containing gas are used. The radical processing apparatus 5 may also be applied to the case of etching a nitride film such as a silicon nitride film (SiN) or silicon (Si) by using radicals obtained by activating a gas containing at least fluorine. The radical processing apparatus 5 may also be applied to the case of etching a metal film by using radicals obtained by activating a gas containing at least chlorine.

A control unit 90 includes a process controller 91 having a microprocessor (computer) for controlling the respective components of the substrate processing system 1. The process controller 91 is connected to a user interface 92 including a keyboard through which an operator inputs commands to manage the substrate processing system 1, a display for visualizing and displaying an operation state of the substrate processing system 1, and the like. The process controller 91 is also connected to a storage unit 93 which stores control programs for realizing various processes performed in the substrate processing system 1, e.g., the supply of the processing gas in the radical processing apparatus 5, the exhaust of the processing chamber 40 and the like, under the control of the process controller 91, processing recipes that are control programs for allowing the respective components of the substrate processing system 1 to perform predetermined processes based on processing conditions, various database and the like. The recipes are stored in an appropriate storage medium (not shown) in the storage unit 93. If necessary, any recipe is read out from the storage unit 93 and executed in the process controller 91. Accordingly, a desired process in the substrate processing system 1 is performed under the control of the process controller 91.

(Operations of the Substrate Processing System)

Hereinafter, processing operations in the substrate processing system 1 configured as described above will be described. First, wafers W, each having on a surface thereof a silicon oxide film, are transferred to the substrate processing system 1 while being accommodated in a carrier C. In the substrate processing system 1, in a state where the gate valve 16 of an atmospheric side is opened, a wafer W is transferred from the carrier C of the loader module 2 to the load-lock chamber 3 and then delivered to the pick of the second wafer transfer unit 17 in the load-lock chamber 3 by one of the transfer arms 11a and 11b of the first wafer transfer unit 11.

Next, the load-lock chamber 3 is vacuum-evacuated by closing the gate valve 16 of the atmospheric side. Then, the gate valves 22 and 54 are opened, and the wafer W is transferred to the radical processing apparatus 5 by extending the pick to the radical processing apparatus 5. Thereafter, the pick is returned to the load-lock chamber 3 and the gate valves 22 and 54 are closed. Then, the radical processing is performed in the radical processing apparatus 5. In the radical processing, a fluorine-containing gas, a hydrogen-containing gas (e.g., $NH_3$), and an $SiO_2$ film formed on the surface of the wafer W react with each other to generate ammonium hexafluorosilicate (AFS) that can be decomposed by heat.

Upon completion of the radical processing, the gate valves 22 and 54 are opened, and the processed wafer W is received by the pick of the second wafer transfer unit 17 and mounted on the mounting table 41 of the processing chamber 40 of the PHT processing apparatus 4. Then, the pick is retracted to the load-lock chamber 3, and the gate valves 22 and 54 are closed. Thereafter, PHT processing is performed by heating the wafer W in the processing chamber 40 of the PHT processing apparatus 4. Accordingly, reaction by-products of AFS generated by the radical processing are sublimated by the heating and removed.

Upon completion of the heat treatment in the PHT processing apparatus 4, the gate valve 22 is opened and the etched wafer W on the mounting table 23 is retreated to the load-lock chamber 3 by the pick of the second wafer transfer unit 17 and then returned to the carrier C by any one of the transfer arms 11a and 11b of the first wafer transfer unit 11. In this manner, processing of a single wafer is completed. The above series of operations are repeated for all the wafers W accommodated in the carrier C.

(Configuration of Radical Processing Apparatus)

Figure 2:
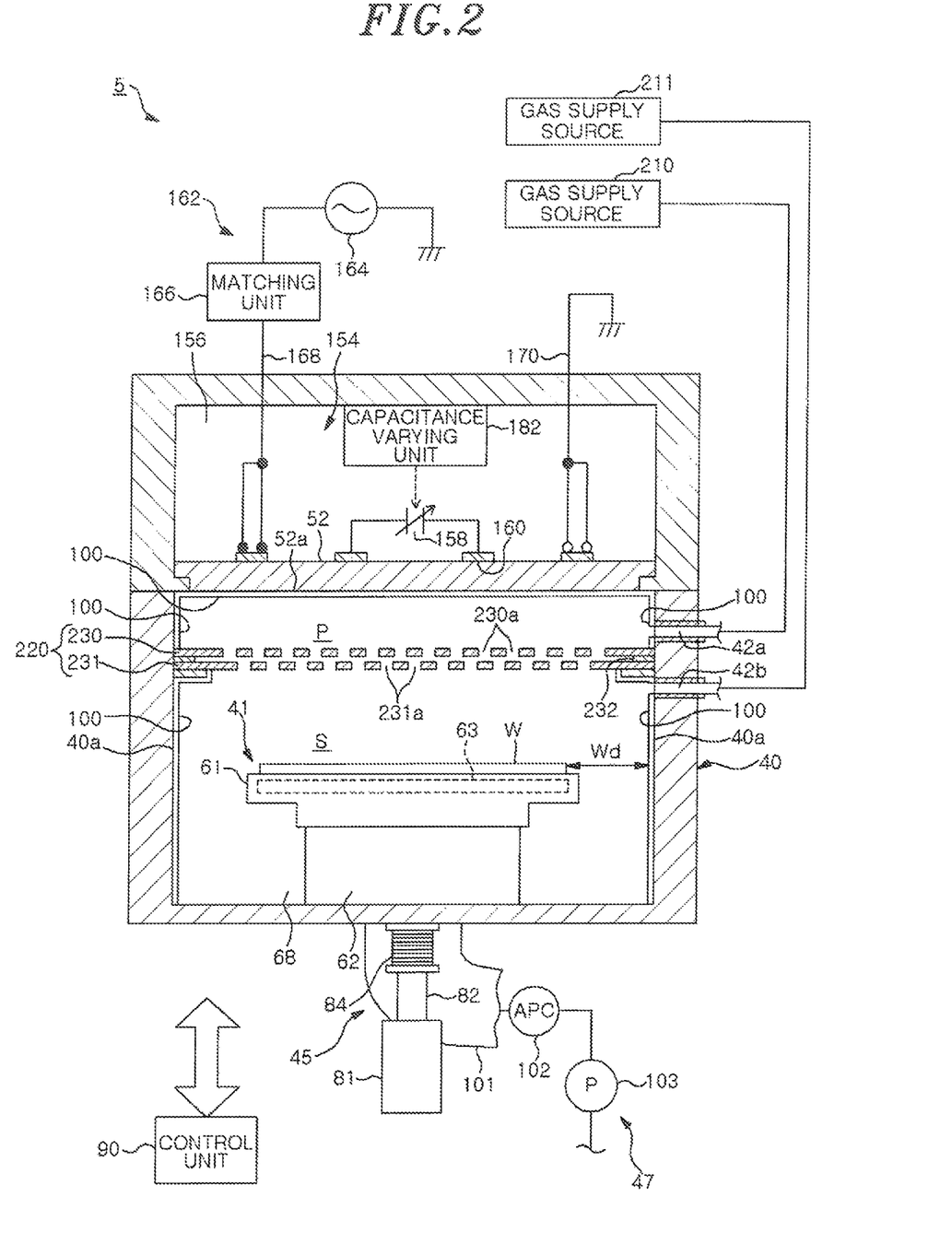
FIG. 2 is a vertical cross sectional view showing an example of the radical processing apparatus according to the embodiment.

Hereinafter, the radical processing apparatus 5 of the present embodiment will be described. FIG. 2 is a cross sectional view showing an example of the radical processing apparatus of the present embodiment. The radical processing apparatus 5 includes the processing chamber 40 having an airtight structure. The processing chamber 40 is made of, e.g., aluminum or aluminum alloy, and has an open top. The open top is blocked by a cover 52 serving as a ceiling portion. A loading/unloading port (not shown) through which the wafer W is transferred to and from the PHT processing apparatus 4 is provided at a sidewall 40a of the processing chamber 40. The loading/unloading port can be opened and closed by the gate valve 54 shown in FIG. 1.

Provided in the processing chamber 40 are the mounting table 41 for horizontally mounting thereon a single wafer W, and an elevation unit 45 for vertically moving the mounting table 41.

The mounting table 41 is formed in a substantially columnar shape. The mounting table 41 includes a mounting plate 61 having a mounting surface for the wafer W and a base block 62 for supporting the mounting plate 61. A temperature control unit 63 for controlling a temperature of the wafer W is provided in the mounting plate 61. The temperature control unit 63 includes a conduit through which a temperature control medium (e.g., water or the like) circulates. The temperature of the wafer W is controlled by heat exchange with the temperature control medium flowing in the conduit. In addition, a plurality of elevating pins (not shown) used when transferring the wafer W is provided at the mounting table 41. The elevating pins can project and retract with respect to the mounting surface for the wafer.

An exhaust gas that has reached a gas exhaust space 68 from a substrate processing space S is uniformly discharged and exhausted by a gas exhaust unit 47.

Gas supply sources 210 and 211 are provided at the outside of the processing chamber 40 and configured to supply desired gases such as a fluorine-containing gas, a hydrogen-containing gas (e.g., $NH_3$), and a dilution gas, e.g., Ar gas, $N_2$ gas or the like, into the processing chamber 40. The gas supply source 210 introduces a gas into the plasma generation space P through a gas inlet line 42*a*. The gas supply source 211 introduces a gas into the substrate processing space S through a gas inlet line 42*b*.

In the etching process of the present embodiment, the wafer W is etched mainly by radicals in the plasma and, thus, it is important to make the radicals uniformly reach the wafer W. However, when a certain gas such as $NH_3$ gas becomes radicals, the amount of etchant may be decreased. In other words, in order to etch an oxide film, $NH_4F$ needs to be generated and adsorbed onto the wafer. However, if the $NH_3$ gas is turned into a plasma, $NH_4F$ is not generated. In that case, it is preferable to introduce a gas into the substrate processing space S while preventing the gas from being turned into a plasma. Therefore, such a gas is introduced into the substrate processing space S through the gas inlet line 42*b* from the gas supply source 211, without being introduced into the plasma generation space S, so that it is not turned into a plasma. In other words, it is selected whether to introduce a gas into the plasma generation space or into the substrate processing space depending on types of films to be etched or types of gases to be used.

As described above, in the radical processing apparatus 5 of the present embodiment, it is possible to select, depending on types of gases, whether to introduce a gas into only the plasma generation space P or both of the plasma generation space P and the substrate processing space S.

The elevation unit 45 is provided at the outside of the processing chamber 40. The elevation unit 45 includes an actuator 81 capable of vertically moving the mounting table 41 and a driving shaft 82 that extends from the actuator 81 through the bellows 84.

The gas exhaust unit 47 includes: a gas exhaust line 101 connected to a gas exhaust port (not shown) formed in a bottom portion of the processing chamber 40; an automatic pressure control valve (APC) 102, provided at the gas exhaust line 101, for controlling a pressure in the processing chamber 40; and a vacuum pump 103 for exhausting the processing chamber 40.

(Partition Plate)

Provided in the processing chamber 40 is a partition plate 220 for dividing an inner space of the processing chamber 40 into the plasma generation space P and the substrate processing space S. The plasma generation space P is a space where a plasma is generated. The substrate processing space S is a space where the wafer W is processed. The partition plate 220 includes at least two plate-shaped members 230 and 231. The two plate-shaped members 230 and 231 are superposed in a direction from the plasma generation space P toward the substrate processing space S. A spacer 232 for maintaining a distance between the plate-shaped members 230 and 231 at a predetermined level is provided between the plate-shaped members 230 and 231. The plate-shaped members 230 and 231 respectively have a plurality of slits 230*a* and 231*a* penetrating therethrough in the superposing direction. The slits 230*a* and 231*a* may be through holes. The slits 230*a* formed in the plate-shaped member 230 are not overlapped with the slits 231*a* formed in the other plate-shaped member 231 when viewed from the superposing direction. The slits 230*a* and 231*a* may be formed in a matrix shape in the plate-shaped members 230 and 231, respectively. In that case as well, the slits 230*a* formed in the plate-shaped member 230 are not overlapped with the slits 231*a* formed in the other plate-shaped member 231 when viewed from the superposing direction.

The plate-shaped members 230 and 231 are made of, e.g., quartz glass. The spacer 232 is preferably made of, e.g., quartz. However, the spacer 232 may be made of aluminum (Al) or silicon (Si). The partition plate 220 which partitions between the plasma generation space P and the substrate processing space S functions as a so-called ion trap for suppressing passage of ions and vacuum ultraviolet light. Accordingly, the number of ions in the substrate processing space S is reduced, which makes it possible to reduce damages caused by collision between the ions and the wafer W.

(Antenna)

The radical processing apparatus 5 of the present embodiment is configured as an inductively coupled plasma etching apparatus using a planar coil type RF antenna. Hereinafter, components related to plasma generation in the inductively coupled plasma etching apparatus will be described.

The cover 52 serving as the ceiling portion of the processing chamber 40 is separated from the mounting table 41 by a comparatively large distance. The cover 52 is, e.g., a circular quartz plate, and serves as a dielectric window. An antenna chamber 156 where an annular RF antenna 154 for generating an inductively coupled plasma in the processing chamber 40 is accommodated while being electromagnetically shielded from the outside is provided, as one unit with the processing chamber 40, on the cover 52.

An annular floating coil 160 having a variable capacitor 158 which can be coupled with the RF antenna 154 by electromagnetic induction is provided in a spiral shape inside the antenna chamber 156 in order to variably control density distribution of the inductively coupled plasma generated in a processing space in the processing chamber 40 in a diametric direction.

A high frequency power feed unit 162 includes a high frequency power supply 164, a matching unit 166, a high frequency power feed line 168, and a return line 170. The high frequency power feed line 168 electrically connects an output terminal of the matching unit 166 and an RF input terminal of the RF antenna 154. The return line 170 is an earth line of a ground potential and electrically connects an RF output terminal of the RF antenna 154 and a ground potential member (e.g., the processing chamber 40 or another member) electrically maintained at a ground potential.

The high frequency power supply 164 is configured to output a high frequency power of a predetermined frequency (generally 13.56 MHz or above) suitable for generation of plasma by inductively coupled high frequency discharge at a variable power. Accordingly, the high frequency power supply 164 supplies energy of the predetermined high frequency into the processing chamber 40. The matching unit 166 has a reactance-variable matching circuit for performing matching between an impedance of the high frequency power supply 164 side and an impedance of a load (mainly, RF antenna, plasma) side. The capacitance of the variable capacitor 158 is varied within a predetermined range by a capacitance varying unit 182 under the control of the control unit 90.

The control unit 90 includes, e.g., a microcomputer, and controls the operations of the respective components of the radical processing apparatus 5, e.g., the gas exhaust unit 47 (the vacuum pump 103), the high frequency power supply 164, the matching unit 166, the gas supply source 210, the gas supply source 211, the capacitance varying unit 182, the chiller unit, the heat transfer gas supply unit and the like, and the operation (sequence) of the entire apparatus.

The control unit 90 includes a CPU, a ROM (Read Only Memory), and a RAM (Random Access Memory). The control unit 90 controls the temperature adjustment or the etching process for the wafer W based on the sequence set in the recipe stored in the RAM or the like. The function of the control unit 90 may be realized by using software or by using hardware.

In the radical processing apparatus 5 of the present embodiment, in order to generate an inductively coupled plasma and perform etching, first, the gate valve is opened and a wafer W as a processing target is loaded into the processing chamber 40 and mounted on the mounting table 41. Then, the gate valve is closed and etching gases are supplied from the gas supply sources 210 and 211 and introduced into the processing chamber 40 at predetermined flow rates and a predetermined flow rate ratio through the gas inlet lines 42a and 42b. A pressure in the processing chamber 40 is controlled to a set level by the gas exhaust unit 47. A high frequency power for plasma generation is outputted at a predetermined RF power by switching on the high frequency power 164 of the high frequency feed unit 162. Accordingly, a high frequency current is supplied to the RF antenna 154 through the matching unit 166, the high frequency feed line 168, and the return line 170.

When an electrostatic chuck is provided at the mounting table 41, a heat transfer gas (He gas) is supplied to a contact interface between the electrostatic chuck and the wafer W and confined in the contact interface by electrostatic attraction force of the electrostatic chuck. Accordingly, the wafer W can be held on the mounting table 41 and a heat transfer effect on the backside of the wafer can be increased.

The etching gas from the gas inlet line 42a is introduced into the plasma generation space P in the processing chamber 40. Magnetic force lines (magnetic flux) generated by a high frequency current flowing in a coil segment of the RF antenna 154 and an induced current flowing in the floating coil 160 penetrate through the cover 52 and traverse the plasma generation space P in the processing chamber 40. Accordingly, an induced magnetic field is generated in an azimuth direction in the processing space. Ionization collision occurs between electrons accelerated in the azimuth direction by the induced electromagnetic field and molecules or atoms of the etching gas. As a result, a doughnut-shaped plasma is generated.

Radicals or ions in the doughnut-shaped plasma are diffused in all directions in a wide processing space. The radicals isotopically move down from the plasma generation space P toward the substrate processing space S while penetrating through the partition plate 220, thereby contributing to the etching of the wafer. On the other hand, the ions are trapped by the partition plate 220 and prevented from reaching the surface of the wafer. Accordingly, the etching of the wafer W by the radicals can be promoted.

The "doughnut-shaped plasma" is not limited to a ring-shaped plasma that is generated only at a diametrically outer side and not generated at a diametrically inner side (central portion) of the processing chamber 40. The "doughnut-shaped plasma" indicates that a volume or a density of a plasma is greater at the diametrically outer side than at the diametrically inner side of the processing chamber 40. The "doughnut-shaped plasma" may not be generated depending on conditions such as types of gases used as the processing gases, a pressure in the processing chamber 40, and the like.

(Processing Operations of Radical Processing Apparatus)

Hereinafter, processing operations of the radical processing apparatus 5 configured as described above will be described. First, in a state where the mounting table 41 is lowered by the actuator 81 through the driving shaft 82, the gate valve is opened and the wafer W is loaded into the processing chamber 40 and mounted on the mounting table 41.

Then, the mounting table 41 is raised by driving the actuator 81, so that a desired substrate processing space S is formed.

Next, a fluorine-containing gas, a hydrogen-containing gas (e.g., $NH_3$), and an inert gas such as $N_2$ gas, Ar gas or the like are introduced from the gas supply sources 210 and 211, and a plasma is generated from the gases by the energy of the high frequency power outputted from the high frequency power supply 164. The $SiO_2$ film on the surface of the wafer W is subjected to the radical processing mainly by the radials of the generated plasma. In the radical processing, the fluorine-containing gas, the hydrogen-containing gas (e.g., $NH_3$), and the $SiO_2$ film formed on the surface of the wafer W react with each other to generate AFS that can be decomposed by heat.

Upon completion of the radical processing, the mounting table 41 is lowered by the actuator 81 of the elevation unit 45. Then, the gate valve is opened so that the processed wafer W can be unloaded.

(Coating Using Quartz)

In the radical processing apparatus 5 of the present embodiment, a portion of the inner wall surface of the processing chamber 40 which is positioned at least above the mounting table 41 is covered by a dielectric material having a recombination coefficient of 0.002 or less. The dielectric material that covers the inner wall surface of the processing chamber 40 preferably has a recombination coefficient of 0.0005 or less.

As for an example of the dielectric material that covers the inner wall surface of the processing chamber 40, a replaceable liner member 100 made of quartz may be used. The partition plate 220 is made of quartz.

Figure 3:
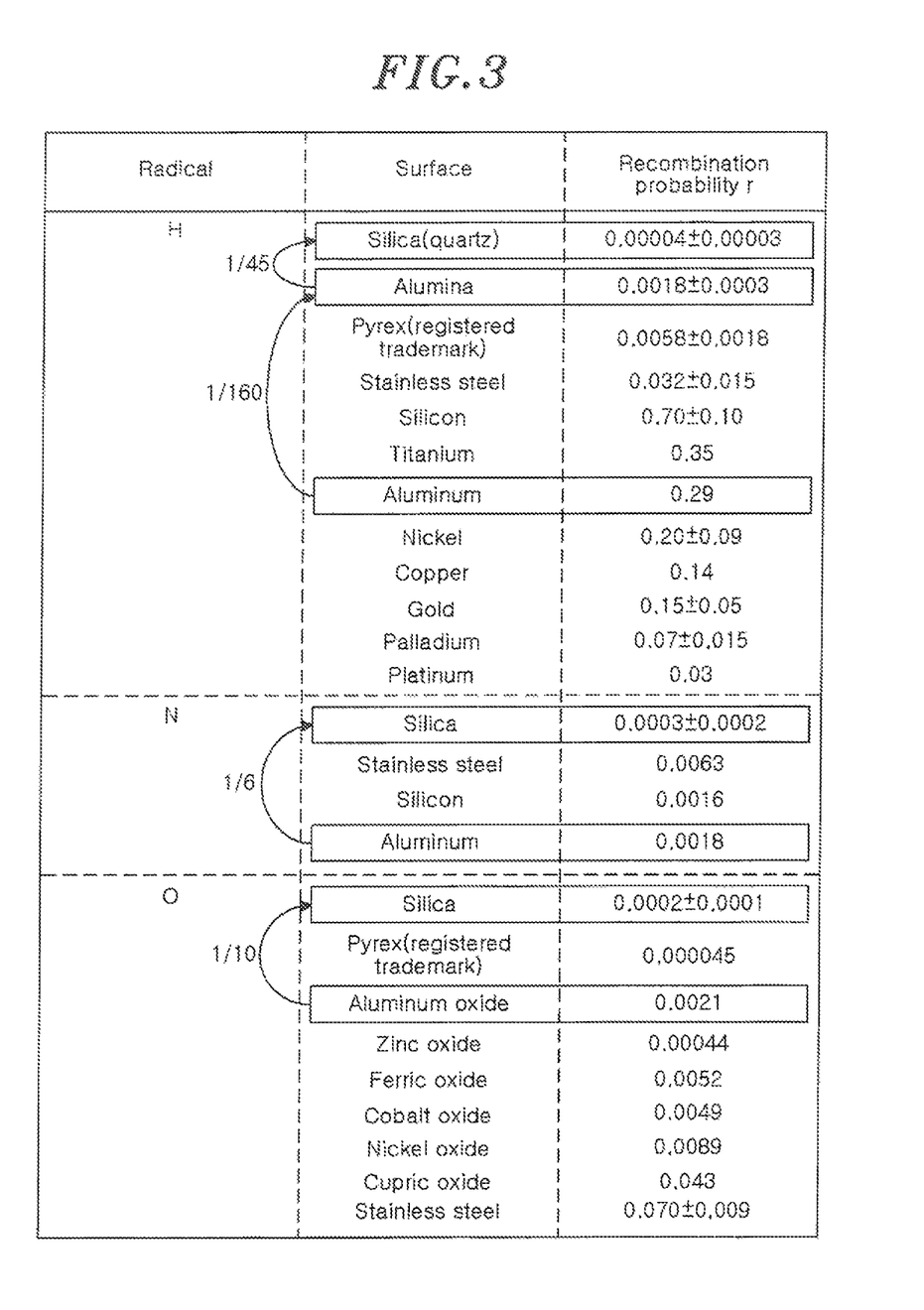
FIGS. 3 and 4 show recombination probabilities of radicals on surfaces.

Radicals are hardly adsorbed on quartz. A table shown in FIG. 3 shows probabilities that H radicals, N radicals and O radicals are recombined on the surface of the component and inactivated (hereinafter, referred to as "recombination probability"). The source of FIG. 3 is H. C. M. Knoops et al., J. Electrochem. Soc., 157 (2010), G241-G249.

According to the table, the recombination probability r of the H radicals on a silica surface of a component is 0.00004±0.00003.

On the other hand, the recombination probability of the H radicals on an alumina ($Al_2O_3$) ceramic surface of a component is 0.0018±0.0003, which is 45 times greater than that on the silica surface of the component. In other words, it is 45 times easier for the H radicals to be adsorbed onto the alumina ceramic surface of the component than onto the silica surface of the component, and the H radicals are more easily inactivated on the alumina ceramic surface of the component than on the silica surface of the component.

The recombination probability of the H radicals on an aluminum (Al) surface of a component of is 0.29, which is 160 times greater than that on the alumina ceramic surface of the component.

The recombination probability of N radicals on a silica surface of a component is 0.0003±0.0002. On the other hand, the recombination probability of the N radicals on an aluminum (Al) surface of a component is 0.0018, which is 6 times greater than that on the silica surface of the component.

The recombination probability of O radicals on a silica surface of a component is 0.0002±0.0001. On the other hand, the recombination probability of the O radicals on an aluminum oxide ($Al(OH)_3$) surface of a component is 0.0021, which is 10 times greater than that on the silica surface of the component.

Figure 4:
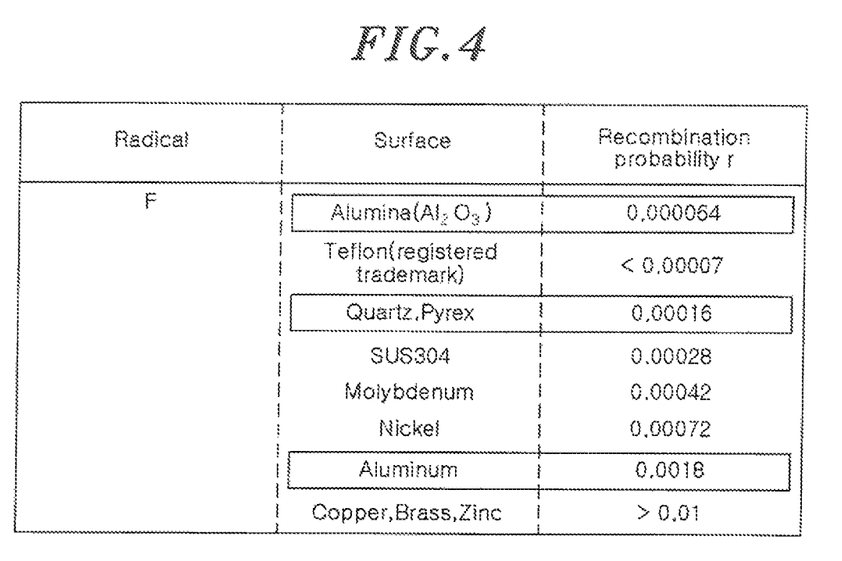

FIG. 4 shows recombination probabilities r of F radicals. The source of FIG. 4 is P. C. NORDINE and J. D. LEGRANGE, "Heterogeneous fluorine atom recombination/reaction on several materials of construction", AIAA Journal, Vol. 14, No. 5 (1976), pp. 644-647.

According to the table, the recombination probability of the F radicals on a quartz surface of a component is 0.00016.

On the other hand, the recombination probability of the F radicals on an alumina ($Al_2O_3$) ceramic surface of a component is 0.000064.

The recombination probability of the F radicals on an aluminum (Al) surface of a component is 0.0018, which is several tens to hundreds of times greater than that on the quartz surface of the component or on the alumina ($Al_2O_3$) ceramic surface of the component.

As described above, in the present embodiment, the portion of the inner wall surface of the processing chamber 40 which is positioned at least above the mounting table 41 in the lowermost position and the partition plate 220 provided above the mounting table 41 are covered by quartz. Therefore, a metal such as aluminum or the like is not exposed to the plasma generation space P or the substrate processing space S. Accordingly, the probability of adsorption and recombination of the radicals on the inner wall surface of the processing chamber 40 can be decreased. In other words, by coating quartz on the inner wall surface of the processing chamber 40 and by using the partition plate 220 made of quartz, the adsorption of the radicals onto the partition plate 220 or the inner wall can be made difficult until the radicals reach the wafer W. As a consequence, it is possible to suppress the inactivation of radicals, improve a decrease in the etching rate especially at the outer peripheral side of the wafer W which is close to the inner wall, and increase in-plane uniformity of the etching rate. Although the portion of the inner wall surface of the processing chamber 40 which is positioned above at least the mounting table 41 in the lowermost position and the partition plate 220 provided above the mounting table 41 may be covered by alumina instead of quartz, it is more preferable to use quartz capable of suppressing inactivation of radicals.

Therefore, in the radical processing apparatus 5 of the present embodiment, a distance Wd from the outer peripheral portion of the wafer W mounted on the mounting table 41 to the inner wall of the processing chamber 40 may be 10 mm or above, as shown in FIG. 2. In other words, the inactivation of radicals may not be considered and, thus, the distance from the outer peripheral portion of the wafer to the inner wall of the processing chamber 40 can be shortened. Accordingly, the volume of the processing chamber can be minimized.

In the present embodiment, quartz is used as the dielectric material that covers the inner wall surface of the processing chamber 40. However, the dielectric material is not limited to quartz. For example, the dielectric material that covers the inner wall surface of the processing chamber 40 may be a dielectric material having a recombination coefficient of 0.002 or less. In the case of using the dielectric material having a recombination efficient of 0.002 or less, it is possible to suppress inactivation of radicals until the radicals reach the wafer W, improve the decrease in the etching rate at the outer peripheral side of the wafer W, and improve the in-plane uniformity of the etching rate of the wafer W. For example, the dielectric material that covers the inner wall surface of the processing chamber 40 may be selected among silicon oxide ($SiO_x$), silicon nitride (SiN), silicon carbide (SiC), alumina ($Al_2O_3$) ceramic, and sapphire.

If a film of the dielectric film is formed by spraying on the inner wall surface of the processing chamber 40, a surface area is increased due to irregularities on the surface. Therefore, the radicals are easily inactivated on the inner wall surface. Accordingly, it is preferable to form the dielectric film that covers the inner wall of the processing chamber 40 by a method other than spraying.

The dielectric material that covers the inner wall surface of the processing chamber 40 is limited to a plasma-resistant material that does not cause metal contamination due to particles. In other words, the dielectric material that covers the inner wall surface of the processing chamber 40 needs to suppress inactivation of the radicals and have high plasma resistance. Further, the dielectric material that covers the inner wall surface of the processing chamber 40 needs to be nonreactive to the radicals.

The partition plate 220 is made of quartz. However, any material may be used as long as it is a dielectric material having a recombination coefficient of 0.002 or less. The surface of the partition plate 220 may be coated by a dielectric material having a recombination coefficient of 0.002 or less.

(Examples of Effect)

Figure 5A:
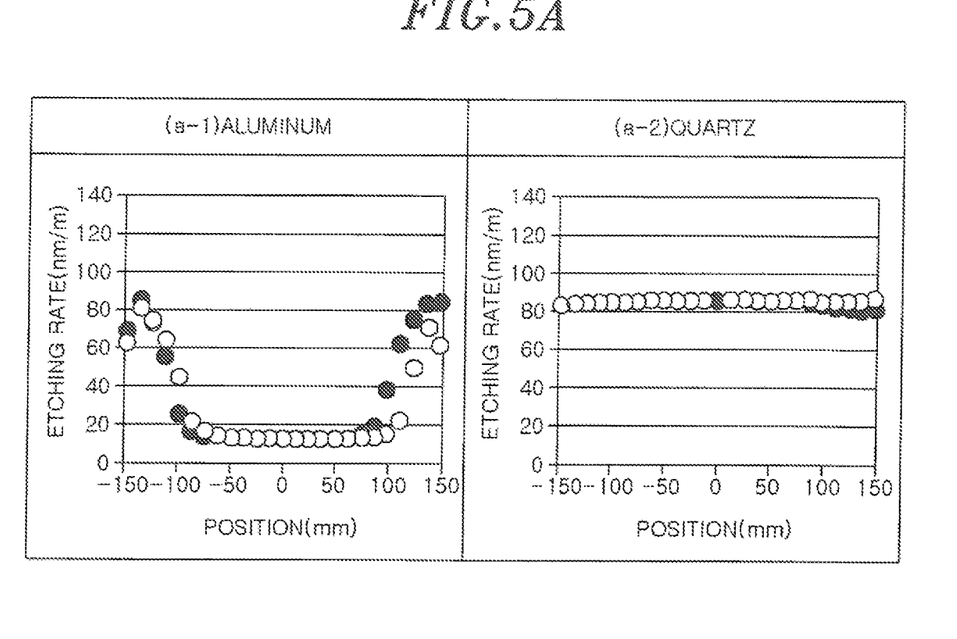
FIGS. 5A and 5B show examples of an etching result obtained by using the radical processing apparatus according to the embodiment and an etching result of a comparative example.
Figure 5B:
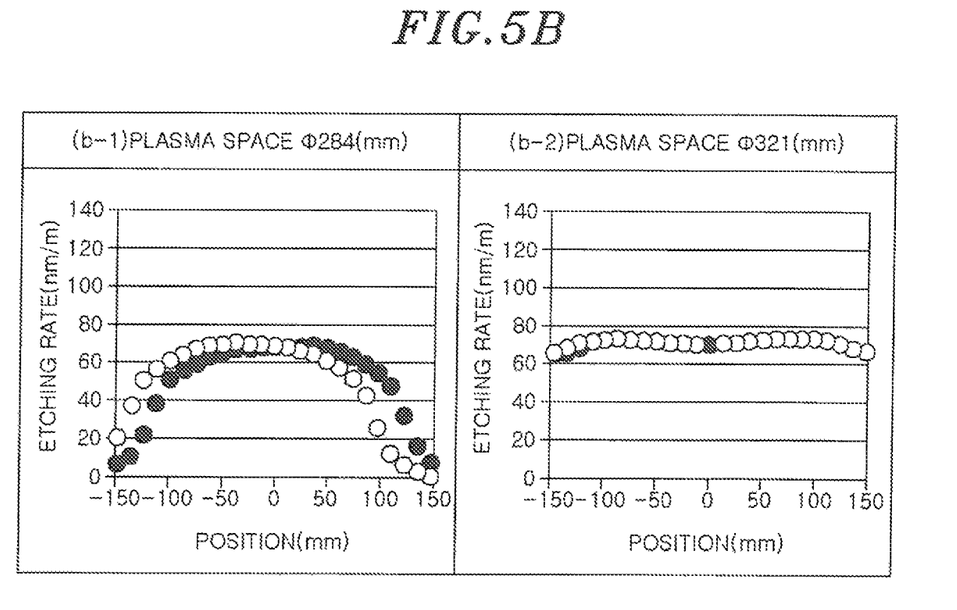

FIGS. 5A and 5B show examples of an etching result of SiN in the case of using the radical processing apparatus 5 of the present embodiment and an etching result of SiN in the comparative example. In FIG. 5A, the graph (a-1) shows an etching rate obtained when the inner wall of the processing chamber 40 is covered by aluminum (comparative example) and the graph (a-2) shows an etching rate obtained when the inner wall of the processing chamber 40 is covered by quartz (present embodiment). The horizontal axis represents a position in a diametric direction of the wafer W, and the vertical axis represents an etching rate.

As a result, the uniformity of the etching rate in the diametrical direction of the wafer W is higher when the inner wall of the processing chamber 40 is covered by quartz (graph (a-2)) than when the inner wall of the processing chamber 40 is covered by aluminum (graph (a-1)). From the above, it is clear that the radical processing apparatus 5 of the present embodiment can achieve the uniformity of the etching rate and promote the etching by covering quartz that hardly inactivates radicals on the inner wall surface of the processing chamber 40.

As shown in FIG. 2, in the radical processing apparatus 5 of the present embodiment, an inner wall surface (the bottom surface of the cover 52) 52a of the ceiling portion of the processing chamber 40 is flat. Therefore, the plasma generation space P can have a diameter of 321 mm, as can be seen from the graph (b-2) of FIG. 5B.

On the other hand, when a stepped portion is formed at an outer peripheral side of the inner wall surface 52a (comparative example), the diameter of the plasma generation space P becomes smaller than 321 mm. For example, as can be seen from the graph (b-1) of FIG. 5B, the diameter of the plasma generation space P becomes 284 mm due to the stepped portion formed at the outer peripheral side of the inner wall surface 52a.

The graphs (b-1) and (b-2) of FIG. 5B show that when the diffusion of the radicals are disturbed by the stepped portion formed at the inner wall surface 52a, the etching rate is decreased and the uniformity deteriorates. On the other hand, in the radical processing apparatus 5 of the present embodiment, the inner wall surface 52a is flat, so that the decrease in the etching rate and the deterioration of the uniformity can be improved.

(Other Applications)

The present disclosure may be variously modified without being limited to the above embodiments. For example, although the above embodiments have described the example in which the wafer W as a target object is processed one by one, the present disclosure may be applied to a substrate processing system 1 for processing two wafers at a time in the radical processing apparatus 5 and the PHT processing apparatus 4. Or, the present disclosure may be applied to a substrate processing system 1 for processing three or more wafers at a time in the radical processing apparatus 5 and the PHT processing apparatus 4.

As described above, in the radical processing apparatus 5 of the present embodiment, the distance Wd from the outer peripheral portion of the wafer W to the inner wall of the processing chamber 40 can be minimized to 10 mm by covering quartz that suppresses inactivation of radicals on the inner wall surface of the processing chamber 40. Therefore, in the radical processing apparatus 5 for processing a plurality of wafers, the mounting position of the wafer W can become closer to the inner wall compared to that in the conventional case, and a degree of freedom in design can be increased.

The above embodiments have described the example in which the present disclosure is applied to the radical processing. However, the present disclosure may also be applied to other processes using a gas, e.g., a film forming process using CVD (Chemical Vapor Deposition) or the like.

In the above embodiment, the gases are introduced from the sidewall of the processing chamber 40 through the gas inlet lines 42a and 42b. However, the gases may be introduced in a shower shape from the ceiling portion.

In the above embodiment, the wafer was described as an example of the target substrate. However, it is not limited thereto, and various substrates for use in LCD (Liquid Crystal Display), FPD (Flat Panel Display) or the like, a photomask, a CD substrate, a printed circuit board and the like may be used.

While the substrate processing apparatus has been described with respect to the above embodiments, the substrate processing apparatus of the present disclosure is not limited to the above embodiments and may be variously changed and modified within the scope of the present disclosure. The features described in the above embodiments may be combined without contradicting each other.

For example, the substrate processing apparatus of the present disclosure may be applied not only to an ICP (Inductively Coupled Plasma) etching apparatus but also to other substrate processing apparatuses, such as a substrate processing apparatus using a CCP (Capacitively Coupled Plasma), a substrate processing apparatus using a radial line slot antenna, a HWP (Helicon Wave Plasma) apparatus, an ECR (Electron Cyclotron Resonance Plasma) apparatus, or the like.

While the disclosure has been shown and described with respect to the embodiments, it will be understood by those skilled in the art that various changes and modifications may be made without departing from the scope of the disclosure as defined in the following claims.

What is claimed is:

1. A substrate processing apparatus for generating a plasma from a gas by a high frequency energy and etching a substrate in a processing chamber by radicals in the plasma, comprising:
   a high frequency power supply configured to supply the high frequency energy into the processing chamber;
   a gas supply source configured to introduce the gas into the processing chamber;
   a mounting table configured to mount the substrate thereon; and
   a partition plate provided in the processing chamber and configured to divide an inner space of the processing chamber into a plasma generation space and a substrate processing space and allow the radicals to penetrate therethrough while suppressing passage of ions therethrough,
   wherein the partition plate and a portion of an inner wall surface of the processing chamber which is positioned at least above the mounting table are covered by a dielectric material having a recombination coefficient of 0.002 or less,
   the partition plate includes at least two plate-shaped members which are superposed in a direction from the plasma generation space toward the substrate processing space, the at least two plate-shaped members respectively having a plurality of slits penetrating therethrough in the superposing direction, and the slits formed in one of the at least two plate-shaped members being not overlapped with the slits formed in the other of the at least two plate-shaped members, and
   a distance from an outer peripheral portion of the substrate mounted on the mounting table to the inner wall surface of the processing chamber is 10 mm or above.

2. The substrate processing apparatus of claim 1, wherein the entire inner wall surface of the processing chamber is covered by a dielectric material having a recombination coefficient of 0.0005 or less.

3. The substrate processing apparatus of claim 1, wherein the dielectric material is selected among silicon oxide ($SiO_x$), silicon nitride (SiN), silicon carbide (SiC), alumina ($Al_2O_3$) ceramic, and sapphire.

4. The substrate processing apparatus of claim 1, wherein the dielectric material is quartz.

5. The substrate processing apparatus of claim 1, wherein the dielectric material that covers the inner wall surface of the processing chamber is a replaceable liner member.

6. The substrate processing apparatus of claim 1, wherein the gas supply source is configured to introduce the gas into only the plasma generation space or into both of the plasma generation space and the substrate processing space.

7. The substrate processing apparatus of claim 1, wherein the high frequency energy is supplied into the plasma generation space from an antenna chamber provided at an outer side of a ceiling portion of the processing chamber through a dielectric window of the ceiling portion.

8. The substrate processing apparatus of claim 1, wherein an inner wall surface of a ceiling portion of the processing chamber is flat.

* * * * *